United States Patent
Aurongzeb

(10) Patent No.: US 9,943,019 B2
(45) Date of Patent: Apr. 10, 2018

(54) METHOD OF PROVIDING A VARIABLE STIFFNESS CHASSIS FOR ULTRATHIN DEVICE

(71) Applicant: Dell Products L.P., Round Rock, TX (US)

(72) Inventor: Deeder M. Aurongzeb, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 222 days.

(21) Appl. No.: 14/796,828

(22) Filed: Jul. 10, 2015

(65) Prior Publication Data

US 2015/0319891 A1 Nov. 5, 2015

Related U.S. Application Data

(63) Continuation of application No. 13/734,572, filed on Jan. 4, 2013, now Pat. No. 9,084,383.

(51) Int. Cl.
*H05K 13/00* (2006.01)
*G06F 1/16* (2006.01)

(52) U.S. Cl.
CPC .......... *H05K 13/00* (2013.01); *G06F 1/1626* (2013.01); *Y10T 29/49002* (2015.01); *Y10T 29/49004* (2015.01)

(58) Field of Classification Search
CPC .... G06F 1/1679; G06F 1/1616; G06F 1/1601; G06F 1/166; B29L 2031/00; Y10T 29/49885

See application file for complete search history.

(56) References Cited

U.S. PATENT DOCUMENTS

| | | | |
|---|---|---|---|
| 5,059,390 A | 10/1991 | Burleigh et al. | |
| 5,482,533 A | 1/1996 | Masuda et al. | |
| 7,580,260 B2 * | 8/2009 | Figuerado | H05K 7/20727 361/679.57 |

(Continued)

OTHER PUBLICATIONS

S.F. Pugh; "XCII. Relations Between the Elastic Moduli and the Plastic Properties of Polycrystalline Pure Metals;" Aug. 1954; pp. 823-843; Serial 7, vol. 45, No. 367; Atomic Energy Research Establishment, Harwell.

(Continued)

*Primary Examiner* — Minh Trinh
(74) *Attorney, Agent, or Firm* — Haynes and Boone, LLP

(57) ABSTRACT

A method for providing a chassis is described. A chassis base that includes at least ninety-five weight percent of a first metal element that is one of Aluminum or Magnesium is provided. The chassis base is doped at an edge section, which extends around the circumference and that is located adjacent a center portion of the chassis base, with at least five weight percent of at least one second metal element that is selected from the group including Lithium, Titanium, Tungsten, Chromium, Hafnium, Lanthanum, and Ytterbium, such that the center portion is not doped with the at least one second metal element. The chassis base is heat treated such that the center portion includes at least ninety-five weight percent of the first metal element and the edge portion of the chassis base includes at least five weight percent of the at least one second metal element.

7 Claims, 12 Drawing Sheets

(56) References Cited

U.S. PATENT DOCUMENTS

| | | | |
|---|---|---|---|
| 8,120,904 B2* | 2/2012 | Morrison | F16M 11/041 248/285.1 |
| 8,341,832 B2 | 1/2013 | Theobald et al. | |
| 8,873,226 B1 | 10/2014 | Peters et al. | |
| 9,084,383 B2* | 7/2015 | Aurongzeb | H05K 13/00 |
| 9,335,787 B2* | 5/2016 | Aurongzeb | G06F 1/1679 |
| 9,671,838 B2* | 6/2017 | North | G06F 1/203 |
| 2005/0012723 A1 | 1/2005 | Pallakoff | |
| 2005/0100728 A1* | 5/2005 | Ristic-Lehmann | A41D 19/01529 428/323 |
| 2007/0041149 A1 | 2/2007 | Homer et al. | |
| 2007/0059901 A1 | 3/2007 | Majumdar et al. | |
| 2009/0110852 A1 | 4/2009 | Chiang | |
| 2011/0019123 A1 | 1/2011 | Prest et al. | |
| 2011/0286172 A1* | 11/2011 | Tseng | G06F 1/181 361/679.31 |
| 2012/0011438 A1 | 1/2012 | Kim et al. | |
| 2012/0314354 A1 | 12/2012 | Rayner | |
| 2012/0327632 A1 | 12/2012 | Park et al. | |
| 2013/0057785 A1 | 3/2013 | Hiramoto et al. | |
| 2013/0257712 A1 | 10/2013 | Imamura | |
| 2014/0007983 A1 | 1/2014 | Prest et al. | |
| 2014/0099472 A1 | 4/2014 | Greenhill et al. | |
| 2014/0153179 A1 | 6/2014 | Fourie | |
| 2014/0192473 A1 | 7/2014 | Aurongzeb | |
| 2014/0362309 A1 | 12/2014 | Tsurusaki et al. | |

OTHER PUBLICATIONS

J. Trivisonno and Charles S. Smith; "Elastic Constants of Lithium-Magesium Alloys;" Dec. 1961; pp. 1064-1071; vol. 9; Acta Metallurgica.

R.W. Lynch and L.R. Edwards; "Thermal-Expansion Coefficients and Grüneisen Parameters of bcc Li—Mg Alloys;" Dec. 1970; pp. 5135-5137; vol. 41, No. 13; Journal of Applied Physics.

M.J. Philippe, F. Wagner, F.E. Mellab, C. Esling and J. Wegria; "Modelling of Texture Evolution for Materials of Hexagonal Symmetry—I. Application to Zinc Alloys;" 1994; pp. 239-250; vol. 42, No. 1, Acta Metall Mater.

L.M. Zhao and Z.D. Zhang; "Effect of Zn Alloy Interlayer on Interface Microstructure and Strength of Diffusion-Bonded Mg—Al Joints;" 2007; pp. 283-286; Scripta Materialia 58; Acta Materialia Inc. Published by Elsevier Ltd.; www.elsevier.com/locate/scriptamat.

G. Mahendran, V. Balasubramanian, and T. Senthilvelan; "Developing Diffusion Bonding Windows for Joining AZ31B Magnesium-AA2024 Aluminium Alloys" 2008; pp. 1240-1244; Materials and Design 30; Elsevier Ltd.; www.elsevier.com/locate/matdes.

Y.B. Yan, Z.W. Zhang, W. Shen, J.H. Wang, L.K. Zhang and B.A. Chin; "Microstructure and Properties of Magnesium AZ31B-Aluminum 7075 Explosively Welded Composite Plate;" 2009; pp. 2241-2245; Materials Science and Engineering A 527; Elsevier B.V.; www.elsevier.com/locate/msea.

* cited by examiner

METHOD OF PROVIDING A VARIABLE STIFFNESS CHASSIS FOR ULTRATHIN DEVICE

CROSS-REFERENCE TO RELATED APPLICATIONS

This is a Continuation application to U.S. Utility application Ser. No. 13/734,572, filed Jan. 4, 2013, entitled "VARIABLE STIFFNESS CHASSIS FOR ULTRATHIN DEVICES," issued as U.S. Pat. No. 9,084,383 on Jul. 14, 2015, the disclosure of which is incorporated herein by reference in its entirety.

BACKGROUND

The present disclosure relates generally to information handling systems, and more particularly to a variable stiffness chassis for information handling systems.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

As IHS components have become smaller yet more powerful, push towards thinner IHS chassis to provide thinner devices has emerged. For example, portable notebook type IHS manufacturers compete to produce the "thinnest" notebook IHS on the market. Because of the way notebook IHSs are used (and particularly held, manipulated, and carried) by users, the "ultrathin" IHS chassis provided for these notebook IHSs has not yet become an issue, and even at current thickness levels for notebook IHSs, the structural integrity of the IHS chassis is sound.

However, the desire for thin IHS chassis has also spread to tablet IHSs. Because of the way tablet IHSs are used (and particularly held, manipulated, and carried) by users, as the IHS chassis for tablet IHSs becomes thinner and thinner, the structural integrity of the IHS chassis of tablet IHSs raises a number of problems.

Accordingly, it would be desirable to provide an improved IHS chassis.

SUMMARY

According to one embodiment, an information handling system (IHS) chassis includes a chassis base; a center portion of the chassis base, wherein the center portion comprises at least ninety-nine weight percent of a first metal element that is one of Aluminum or Magnesium; and an edge section of the chassis base that extends around the circumference of the chassis base adjacent the center portion, wherein the edge section is comprised of an alloyed material that includes the first metal element and at least five weight percent of at least one second metal element that is selected from the group including Lithium, Titanium, Tungsten, Chromium, Hafnium, Lanthanum, and Ytterbium.

BRIEF DESCRIPTION OF THE DRAWINGS

FIG. 2b is a rear perspective view illustrating an embodiment of the information handling system chassis of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
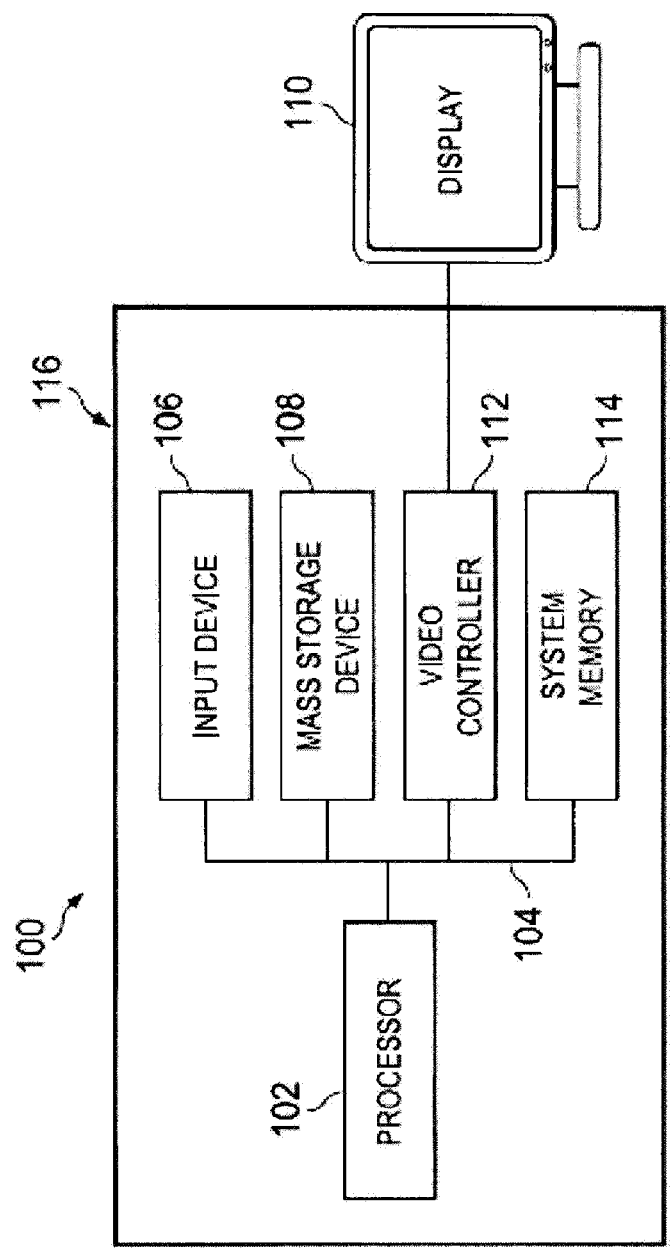
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
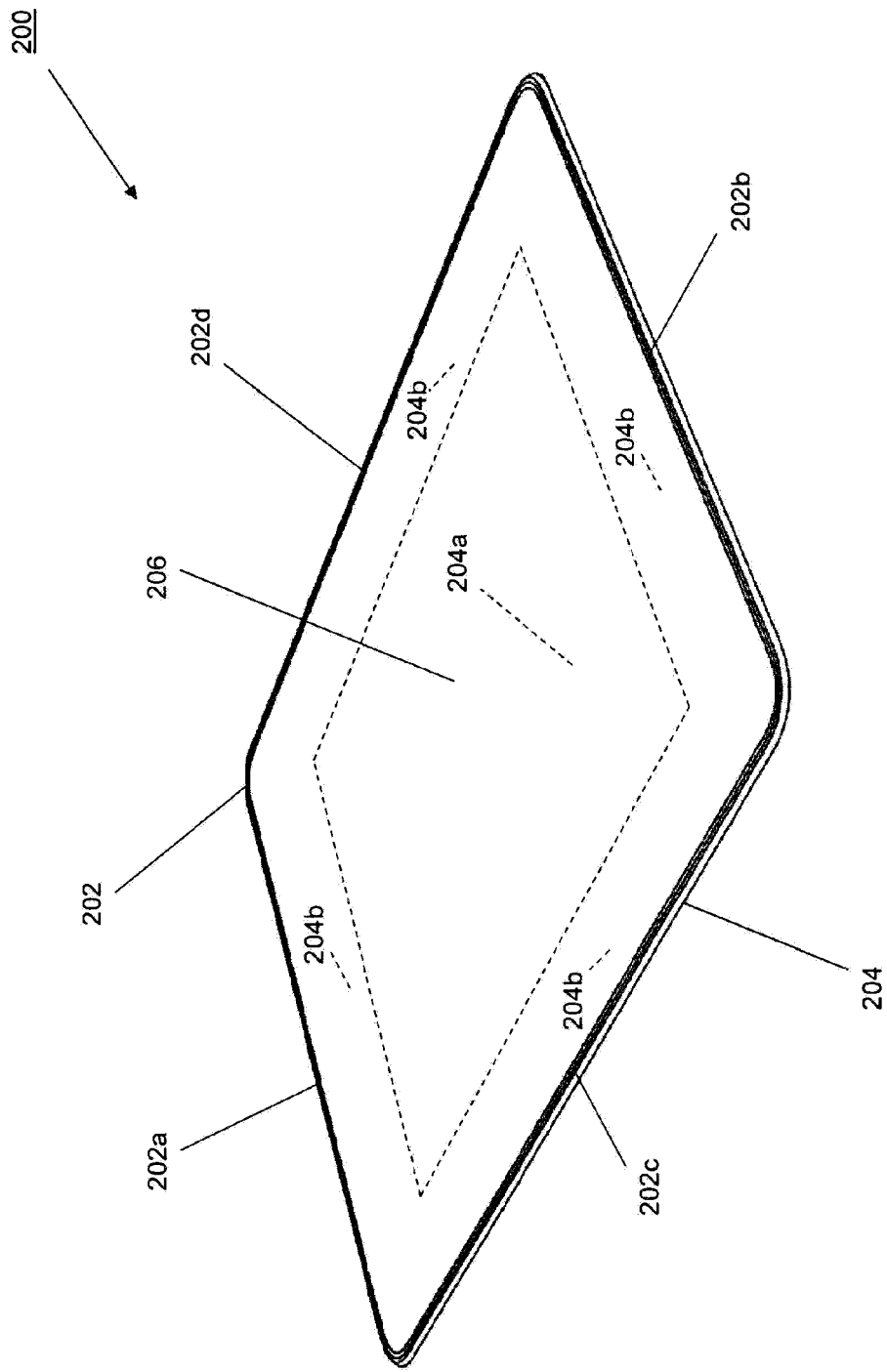
FIG. 2a is a front perspective view illustrating an embodiment of an information handling system chassis.
Figure 2B:
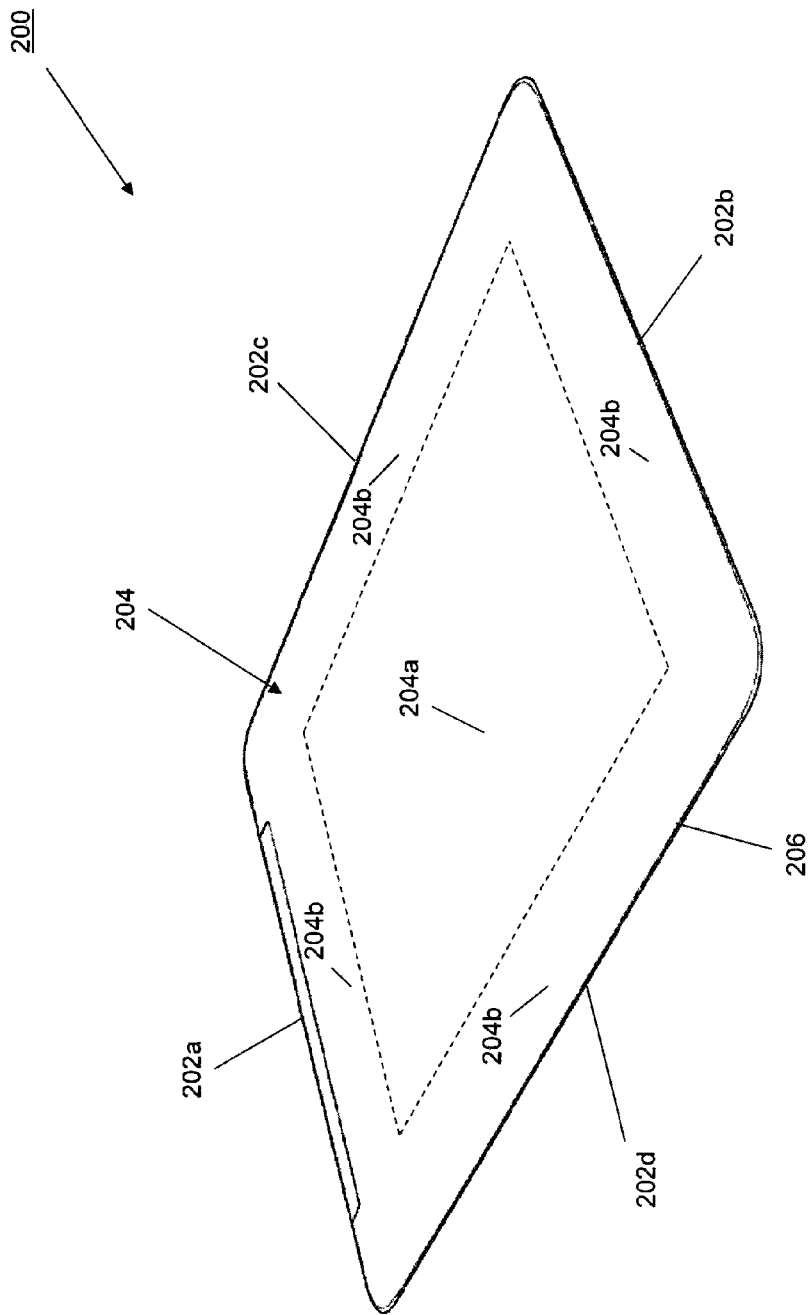

Referring now to FIGS. 2a and 2b, an embodiment of an IHS 200 is illustrated. In an embodiment, the IHS 200 may be the IHS 100, discussed above with reference to FIG. 1, and/or may include some or all of the components of the IHS 100. In the illustrated embodiment, the IHS 200 is a tablet IHS that is described as experiencing particularly high forces and particularly, flexure stresses due to the handling of the tablet IHS by a user. However, the teachings of the present disclosure may be applied to a variety of IHSs known in the art, each of which may each experience forces and stresses that are different than those experienced by the tablet IHS discussed below, and each of which may benefit from the teachings of the present disclosure. The IHS 200 includes a chassis base 202 having a top edge 202a, a bottom edge 202b located opposite the chassis base 202 from the top edge 202a, and a plurality of side edges 202c and 202d extending between the top edge 202a and the bottom edge 202b and on opposite sides of the chassis base 202. The chassis base 202 provides a rear surface 204 of the IHS 200 that includes a center portion 204a (bounded by the dashed line in FIG. 2b) and an edge section 204b that extends around the circumference of the chassis base 202 from the center portion 204 and to each of the top edge 202a, the bottom edge 202b, and the side edges 202c and 202d. The portion of the chassis base 202 that provides the edge section 204b may vary in different embodiments, but as discussed with reference to a number of experimental embodiments below, an embodiment of the edge section 204b may extend from a perimeter edge (e.g., from the top edge 202a, the bottom edge 202b, and each of the side edges 202c and 202d) approximately 30% of the length of the chassis base 202 (e.g., from the top edge 202a or the bottom edge 202b to approximately 30% of the distance between the top edge 202a and the bottom edge 202b as measured using a line parallel to the sides edges 202c and 202d) or the width of the chassis base 202 (e.g., from the side edge 202c or the side edge 202d to approximately 30% of the distance between the side edges 202c and 202d as measured using a line parallel to the top edge 202a and the bottom edge 202b). Furthermore, while the embodiments discussed below provide an edge section 204b with an increased stiffness relative to the center portion 204a, the systems and methods described herein may be applied to increase the local stiffness of any portion of a chassis or other thin-walled structure.

A front surface 206 is provided on the IHS 200 opposite the rear surface 204 and extending between the top edge 202a, the bottom edge 202b, and the side edges 202c and 202d. The front perspective view of the IHS 200 illustrated in FIG. 2a includes a dashed line to indicate the relative locations of the center portion 204a and edge section 204b of the chassis base 202. The IHS 200 defines an IHS housing 208 between a first wall 210 on the chassis base 202 that includes the rear surface 204 and a second wall 212 that includes the front surface 206 and that may be part of the chassis base 202 (e.g., on a bezel that provides the edge section 204b) or part of a component (e.g., display screen glass) that couples to the chassis base 202. The IHS housing 208 houses the components of the IHS 200 between the top edge 202a, the bottom edge 202b, the side edges 202c and 202d, the rear surface 204, and the front surface 206. One of skill in the art will recognize that a display (e.g., the display 110 of FIG. 1) may be provided such that it includes or is visible through the front surface 204 of the IHS 200.

Figure 2C:
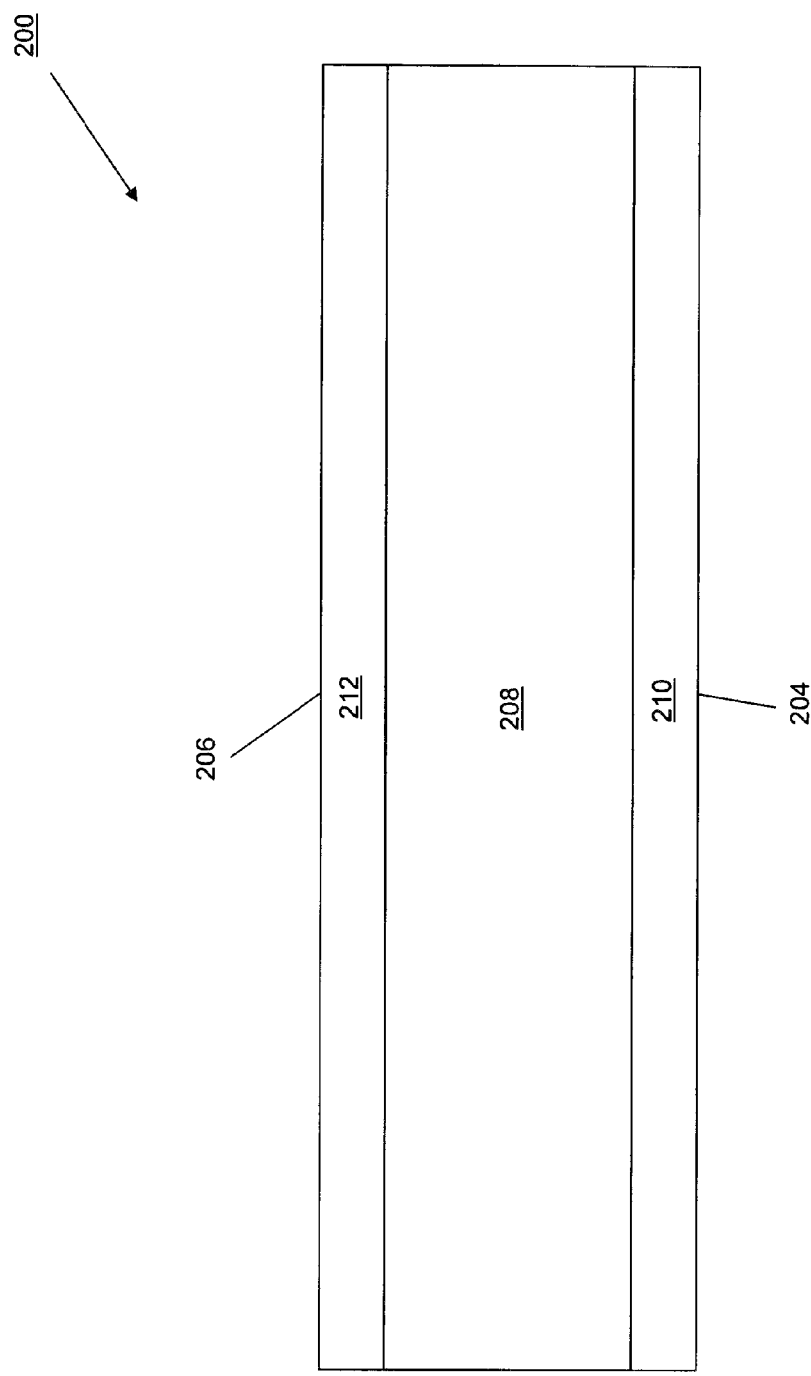
FIG. 2c is a cross-sectional view illustrating an embodiment of the information handling system chassis of FIGS. 2a and 2b.
Figure 3:
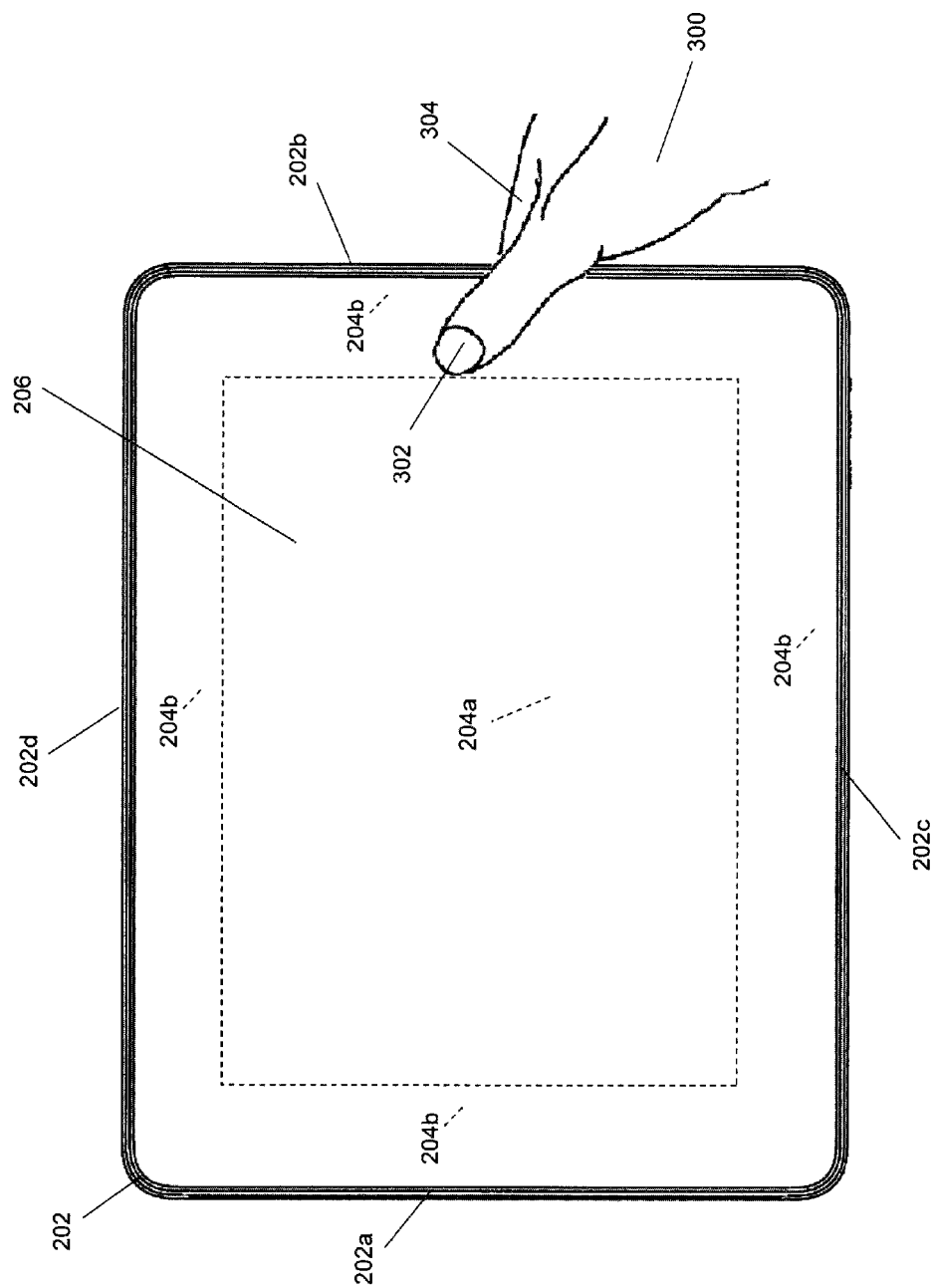
FIG. 3 is a front view illustrating an embodiment of the information handling system chassis of FIGS. 2a and 2b being used.

FIG. 3 illustrates an embodiment of a user using the IHS 200. As is known in the art of table IHSs, a user may handle and use the IHS 200 by gripping one or more the edge section(s) 204b with the fingers on their hands. For example, in the embodiment illustrated in FIG. 3, a user is using a single hand 300 to handle the IHS 200 by gripping the IHS 200 at an edge section 204b with a thumb 302 on the front surface 206 and fingers 304 on the rear surface 206. Using this and other methods for handling the IHS 200 produces high forces and stresses on the edge portion 204a of the chassis base 202. As the walls of the chassis base 202 (e.g., the first wall 210 and, in some embodiments, the second wall 212, illustrated in FIG. 2c) are made thinner to provide a thinner IHS 200, such high forces and stresses may threaten the structural integrity of the chassis base 202 at the edge portion(s) 204b. The present disclosure describes a chassis base 202 (and a method for providing a chassis base 202) that varies in stiffness at the edge section 204b with respect to the center portion 204a in order to provide a structure that is capable of maintaining structural integrity when experiencing the high forces and stresses discussed above. While the IHS 200 in the illustrated embodiment has been described as a tablet IHS that experiences particularly force and stresses in particular portions of the tablet IHS due to handling and use, one of skill in the art will recognize that other IHSs (e.g., notebook IHSs) and/or other thin chassis devices will benefit from the present disclosure as well.

Figure 4:
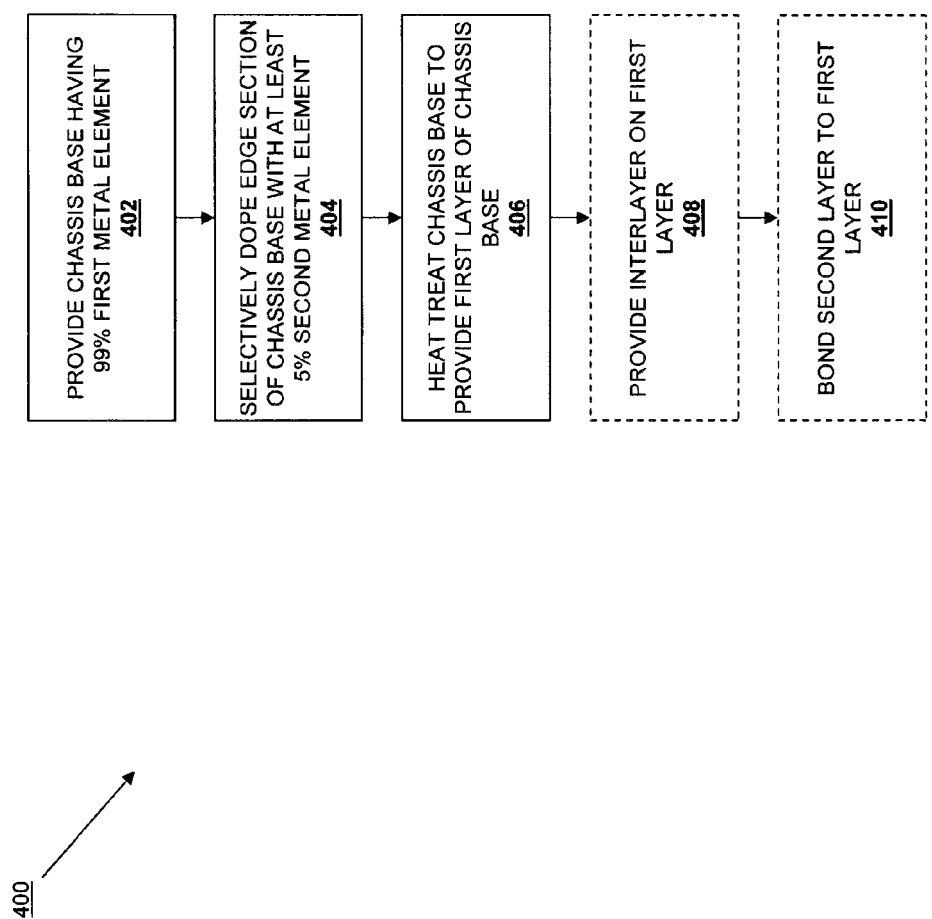
FIG. 4 is a flow chart illustrating an embodiment of a method for providing an information handling system chassis.

Referring now to FIG. 4, an embodiment of a method 400 for providing an IHS chassis is illustrated. The method 400 begins at block 402 where a chassis base having at least 95 weight percent (wt. %) a first metal element is provided. In an embodiment, the chassis base is provided that is at least 95 wt. % Aluminum. For example, the chassis base may be provided with an Aluminum alloy that is 99 wt. % Aluminum and that includes 1 wt. % materials such as, for example, Niobium, Lithium, Nickel, Silicon, Titanium, Magnesium, and/or a variety of other Aluminum alloy materials know in the art. In another embodiment, the chassis base is provided that is at least 95 wt. % Magnesium. For example, the chassis base may be provided with a Magnesium alloy that is 99 wt. % Magnesium and that includes 1 wt. % materials such as, for example, Niobium, Lithium, Silicon, Titanium, Aluminum, and/or a variety of other Magnesium alloy materials know in the art. In an embodiment, the chassis base provided at block 402 of the method 400 may be a raw material for manufacturing the chassis base 202 of the IHS 200, discussed above, and may be formed later into the chassis base 202 for use with the IHS 200. In another embodiment, the method 400 may be performed on a chassis base 202 that includes the structure to provide the IHS 200 and that is then doped (e.g., by ion bombardment, film deposition, etc), heat treated, and processed further according to the method 400, as discussed below.

As discussed below, in one embodiment, the chassis base 202 may include a 99 wt. % Magnesium or Aluminum alloy that is doped at the edge section 204b during the method 400. However, embodiments including at least 95 wt. % Magnesium, Aluminum, or Titanium alloy that is doped at the edge section 204b during the method 400 are envisioned as falling within the scope of the present disclosure. Furthermore, Magnesium and Aluminum alloys are metal alloys that can provide relatively low-weight and high strength in structural applications. However, the use of Magnesium or Aluminum alloys in large scale manufacturing operations is limited for a number of reasons. For example, Magnesium and Aluminum alloys tend to lack stiffness at room temperature, and tend to form sharp basal or near-basal deformation textures (i.e., the grains of the Magnesium or Aluminum alloy tend to rotate to preferred orientations during deformation) that can lead to strong anisotropy in the structure. Thus, Magnesium and Aluminum alloys, when experiencing handling forces, tend to deform and crack when formed as relatively thin structures (e.g., structures with a wall thickness of less than 1 millimeter). However, at least some embodiments of the present disclosure solve these issues by providing a thin walled (e.g., approximately 1 millimeter or less), low density, stable phase doped Magnesium or Aluminum alloy at the edge portion 204b of the chassis base 202 that is relatively stiff (e.g., relative to the center portion 204a) without a tendency to deform and crack when experiencing forces and stresses resulting from the handling of the chassis base 202.

The method 400 then proceeds to block 404 where the edge section of the chassis base is selectively doped with at least 5 wt. % a second metal element. In an embodiment, the edge section of the chassis base (e.g., the edge section 204b of the chassis base 202 having the structure to provide the IHS 200, a portion of a raw material for manufacturing the chassis base 202 of the IHS 200 that is known will provide the edge section 204b of that chassis base 202, etc.) is doped with at least 5 wt. % of at least one of Lithium, Titanium, Tungsten, Chromium, Hafnium, Lanthanum, and/or Ytterbium. In an embodiment, the doping of the edge section of the chassis base at block 404 may be accomplished by ion implantation, film deposition, metal bonding and diffusion, and/or using a variety of other doping techniques known in the art. For example, at block 404, the edge section of the chassis base may be doped with at most 20 wt. % Lithium. In another example, at block 404, the edge section of the chassis base may be doped with at most 20 wt. % Lithium and at most 5 wt. % Lanthanum, Ytterbium, and/or another rare earth metal that reduces the volatility of Lithium. In another example, at block 404, the edge section of the chassis base may be doped with at most 20 wt. % Lithium and at most 5 wt. % Hafnium.

Continuing the discussion of the example above in which the chassis base includes a 99% wt. % Magnesium allow, at block 404 of the method 400, the edge section 204b of the chassis base 202 may be doped with Lithium. A Magnesium and Lithium alloy has a Body Centered Cubic (BCC) phase at room temperature, and that BCC phase may be stabilized with as little as 30 atomic percent (at. %) Lithium. Thus, the doping of the Magnesium alloy using Lithium decreases the density of the Magnesium alloy while stabilizing the BCC phase. In an embodiment, the Magnesium alloy/Lithium doped chassis base 202 will be a mixed phase alloy having BCC and Hexagonal Close Packed (HCP) structure.

The method 400 then proceeds to block 406 where the chassis base is heat treated to provide a first layer of the chassis base. In an embodiment, at block 406, the chassis base is heat treated following the doping in block 404 to provide a first layer of the chassis base 202 having the center portion 204a that include at least 95 wt. % the first metal element, and having the edge section 204b that includes the first metal element doped with at least 5% the second metal element. In an embodiment, the heat treating at block 406 may include heat treating the chassis base 202 at greater than 80% of its melting point. In one example, the chassis base 202 is an Aluminum alloy materials, and the heat treating includes heat treating the chassis base 202 at greater than 80% the melting point of Aluminum or approximately 500 degrees Celsius in an inert argon atmosphere.

Figure 10:
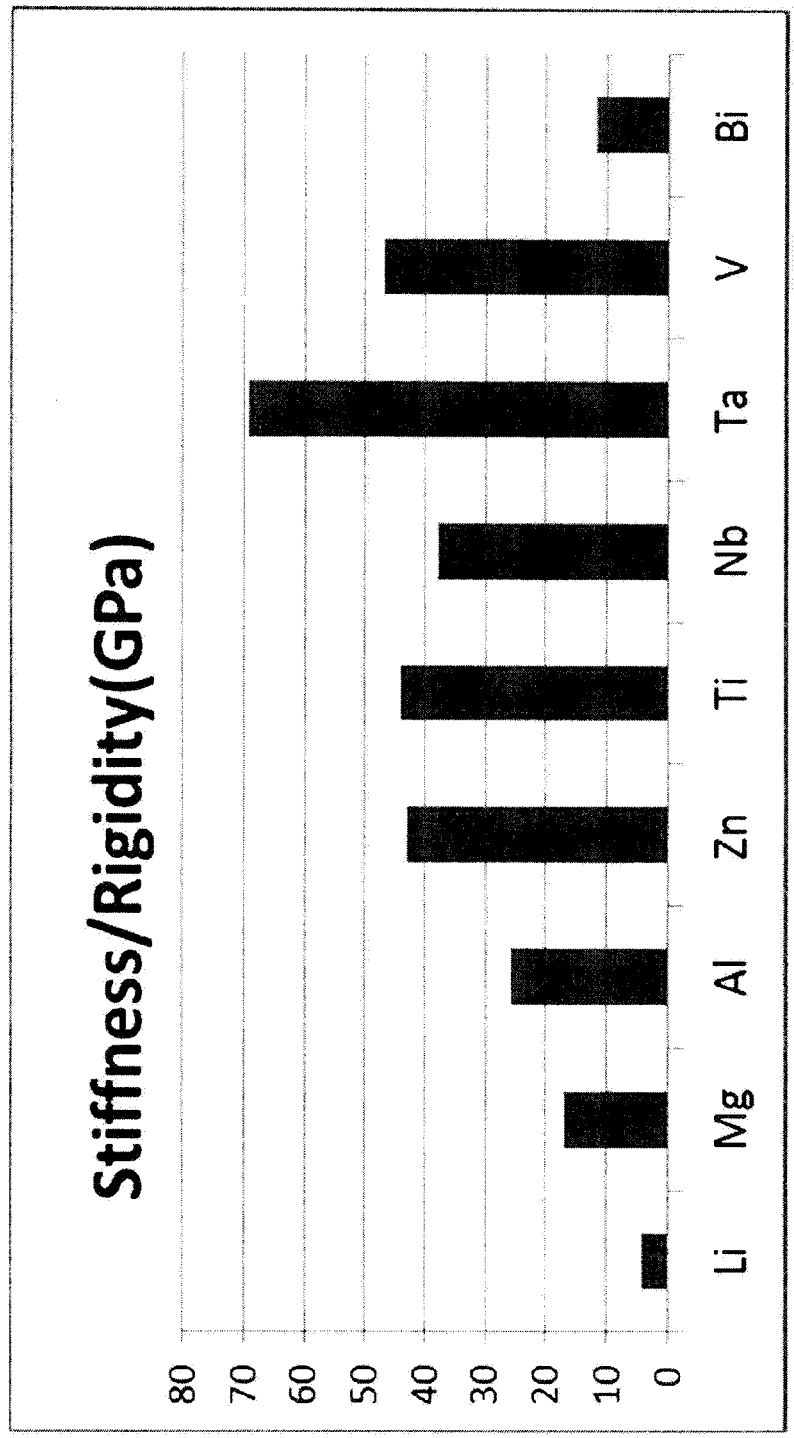
FIG. 10 is a bar graph illustrating the stiffness/rigidity of a plurality of different metal elements.

In one example, block 406 may provide the first layer of the chassis base 202 with the center portion 204a having 99 wt. % Aluminum and the edge portion 204b including Aluminum and at most 20 wt. % Lithium. In another example, block 406 may provide the first layer of the chassis base 202 with the center portion 204a having 99 wt. % Magnesium and the edge portion 204b including Magnesium and at most 20 wt. % Lithium. In another example, block 406 may provide the first layer of the chassis base 202 with the center portion 204a having 99 wt. % Aluminum and the edge portion 204b including Aluminum, at most 20 wt. % Lithium, and at most 5 wt. % Lanthanum or Ytterbium (i.e., rare earth metals that reduce the volatility of Lithium). In another example, block 406 may provide the first layer of the chassis base 202 with the center portion 204a having 99 wt. % Magnesium and the edge portion 204b including Magnesium, at most 20 wt. % Lithium, and at most 5 wt. % Lanthanum or Ytterbium (i.e., rare earth metals that reduce the volatility of Lithium). In another example, block 406 may provide the first layer of the chassis base 202 with the center portion 204a having 99 wt. % Aluminum and the edge portion 204b including Aluminum, at most 20 wt. % Lithium, and at most 5 wt. % Hafnium. In another example, block 406 may provide the first layer of the chassis base 202 with the center portion 204a having 99 wt. % Magnesium and the edge portion 204b including Magnesium, at most 20 wt. % Lithium, and at most 5 wt. % Hafnium. While the examples above include primarily Lithium and Hafnium as the doping elements, any metal with a relatively high modulus may be used as the dopant to provide increased stiffness. FIG. 10 illustrates this by providing the stiffness of a plurality of metal elements that, in different embodiments, may be used as the dopant.

In some embodiments, the method 400 may end at block 406. Thus, the first layer of the chassis base 202 may be the only layer of the chassis base 202. However, in some embodiments, the method 400 may proceed to optional blocks 408 and/or 410, where an interlayer may be provided on the first layer and/or a second layer may be bonded to the first layer. Several experimental embodiments including the interlayer and/or second layer are discussed below, but one of skill in the art will recognize that a wide variety of modification may be provided to those embodiments while remaining within the scope of the present disclosure. The experimental embodiments discussed involved creating a rectangular chassis base, according to the method 400, having a thickness of less than or equal to 1 millimeter, as it has been found that at those thicknesses, deflection may be high enough to cause damage to components housed by the chassis base 202. The flexure stress $\sigma_m$ (which depends on the length, width, and thickness of the rectangular chassis base) and in some cases the bulk modulus K, of an edge portion of that chassis base was then determined. For the experimental embodiments, the edge portion of the chassis was measured from a perimeter edge of the chassis base, and extended towards the chassis base no more than 30% of the overall length or width (depending whether the measurement was made from an edge that defined the length or an edge that defined the width.) Thus, a chassis base with a center portion and edge section that was very similar to the chassis base 202 having the center portion 204a and edge section 204b illustrated in FIG. 2b was provided in the experimental embodiments discussed below.

Figure 5:
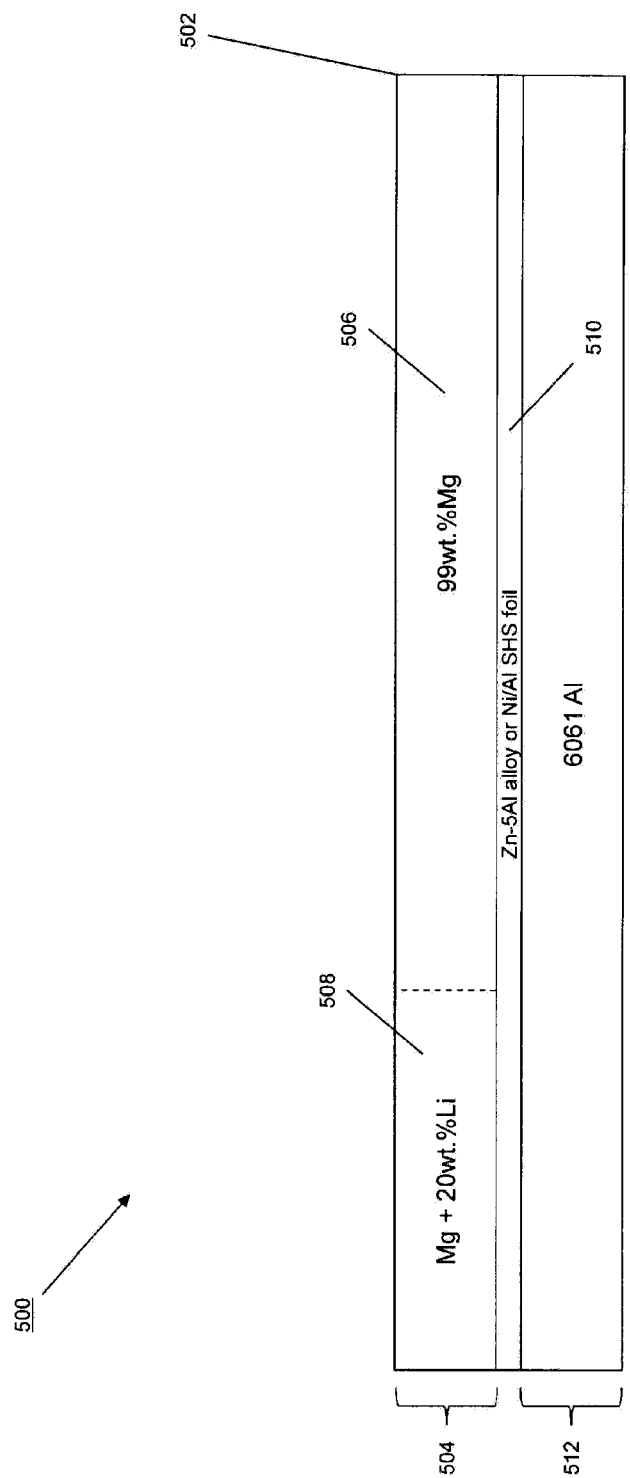
FIG. 5 is a cross-sectional view illustrating an experimental embodiment of a chassis base.

Referring now to FIG. 5, in an experimental embodiment 500, blocks 402, 404, and 406 of the method 400 provided a chassis base 502 having a first layer 504 with the center portion 506 including 99 wt. % Magnesium and the edge portion 508 including Magnesium and 20 wt. % Lithium. In one experimental example, at block 408, an interlayer 510 of Zinc 5% Aluminum (Zn-5Al) was provided on the first layer 504. In another experimental example, at block 408, an interlayer 510 of Nickel/Aluminum Self-propagating High-temperature Synthesis (SHS) foil was provided on the first layer 504. In both experimental examples, at block 410, a second layer 512 including 6061 aluminum was diffusion bonded to the first layer 504. As is known in the art, diffusion bonding (or other solid state welding techniques) join metal materials (which may be dissimilar) by migrating atoms across a joint between the two metal materials (due to concentration gradients) at elevated temperatures (e.g., 50-70% the melting temperature of the materials) and under pressure that relieves any voids between the materials that may result from different surface topologies. The resulting chassis base 502 included an edge section 508 capable of withstanding a flexure stress $\sigma_m$ of greater than 80 MPa and having a bulk modulus K of greater than 20 GPa.

Figure 6:
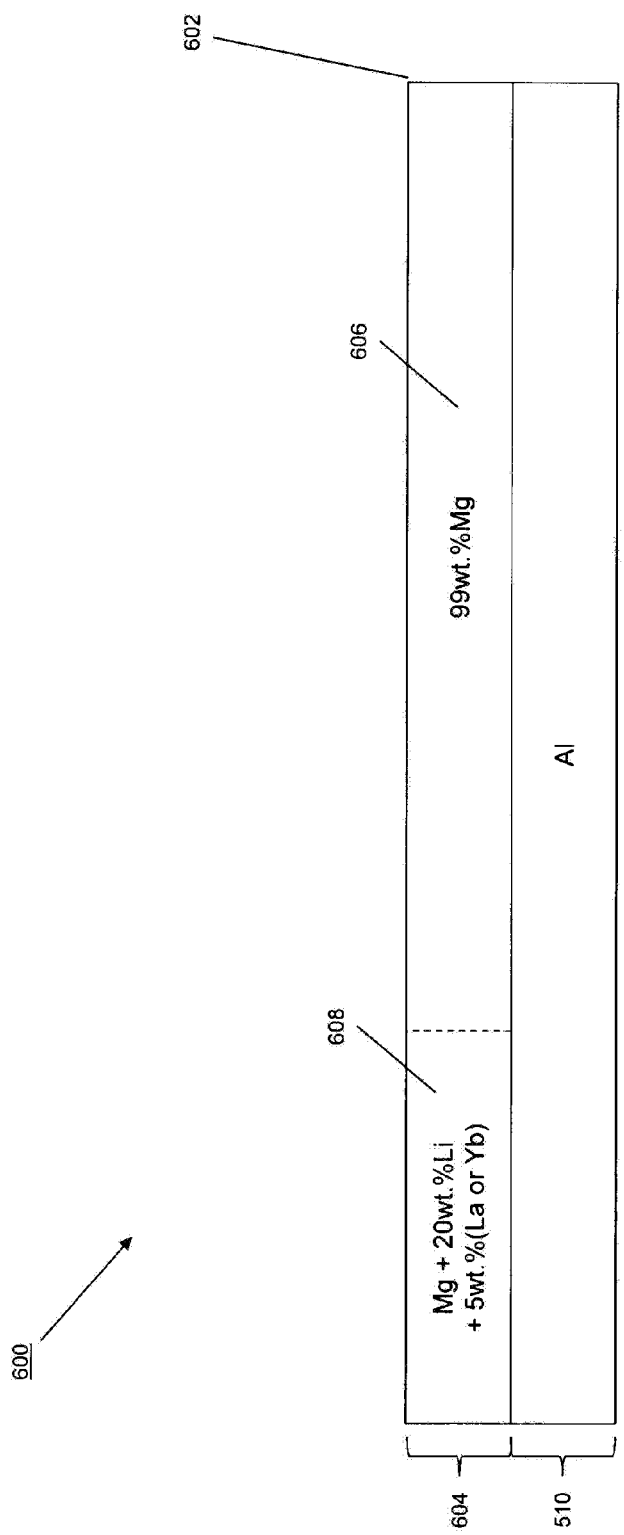
FIG. 6 is a cross-sectional view illustrating an experimental embodiment of a chassis base.

Referring now to FIG. 6, in another experimental embodiment 600, blocks 402, 404, and 406 of the method 400 provided a chassis base 602 having a first layer 604 with the center portion 606 including 99 wt. % Magnesium and the edge portion 608 including Magnesium, 20 wt. % Lithium, and 5 wt. % rare earth metal (e.g., Lanthanum or Ytterbium.) No interlayer was provided in this experimental embodiment. At block 410, a second layer 610 including at least 95 wt. % Aluminum was diffusion bonded to the first layer 604. The resulting chassis base 602 included an edge section 608 capable of withstanding a flexure stress $\sigma_m$ of greater than 40 MPa.

Figure 7:
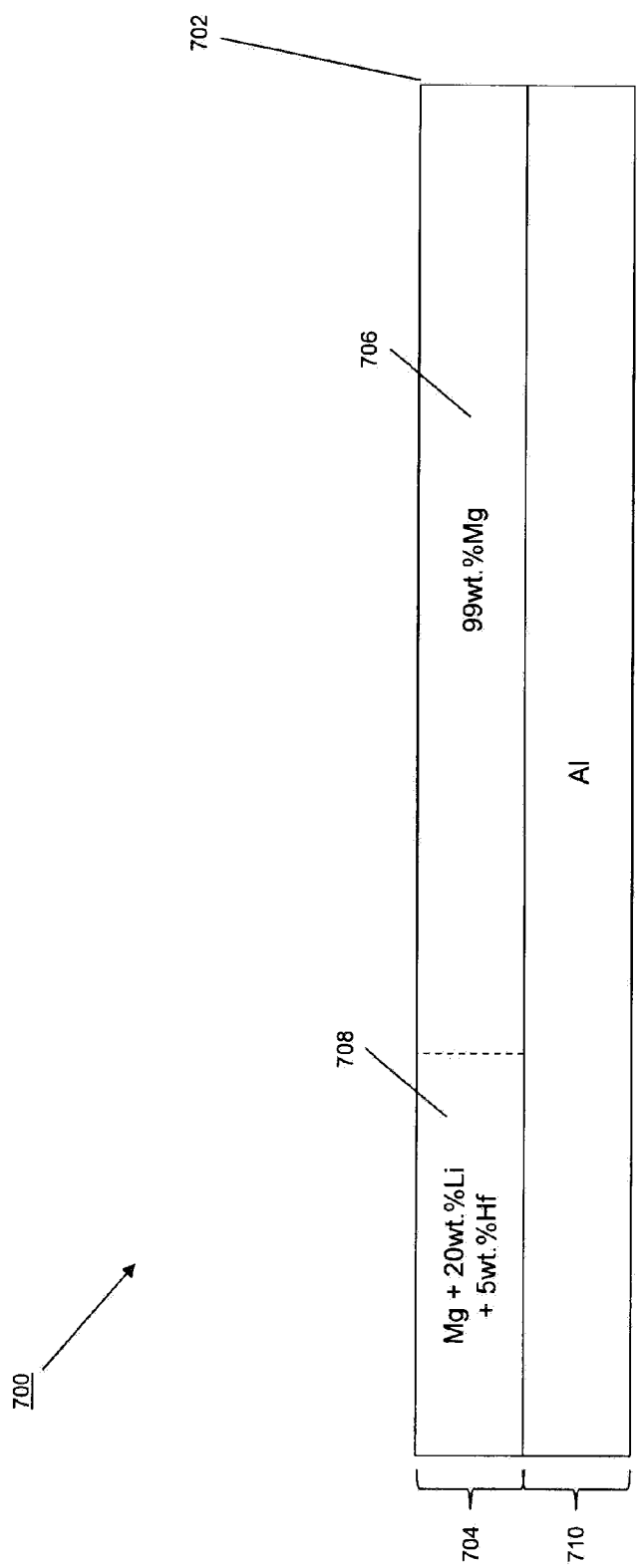
FIG. 7 is a cross-sectional view illustrating an experimental embodiment of a chassis base.

Referring now to FIG. 7, in another experimental embodiment, blocks 402, 404, and 406 of the method 400 provided a chassis base 702 having a first layer 704 with the center portion 706 including 99 wt. % Magnesium and the edge portion 708 including Magnesium, 20 wt. % Lithium, and 5 wt. % Hafnium. No interlayer was provided in this experimental embodiment. At block 410, a second layer 710 including at least 95 wt. % Aluminum was diffusion bonded to the first layer 704. The resulting chassis base 702 included an edge section 708 capable of withstanding a flexure stress $\sigma_m$ of approximately 41 MPa and having a bulk modulus K of greater than 30 GPa.

Figure 8:
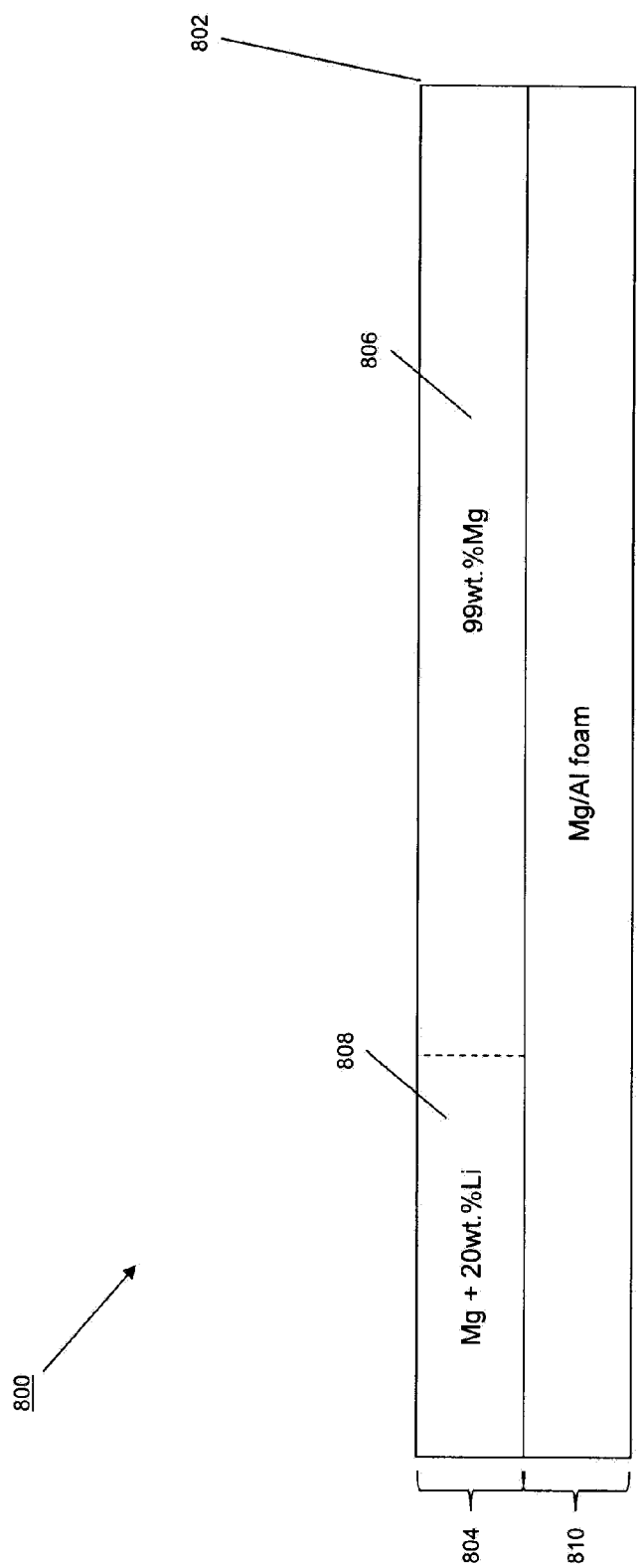
FIG. 8 is a cross-sectional view illustrating an experimental embodiment of a chassis base.
Figure 9:
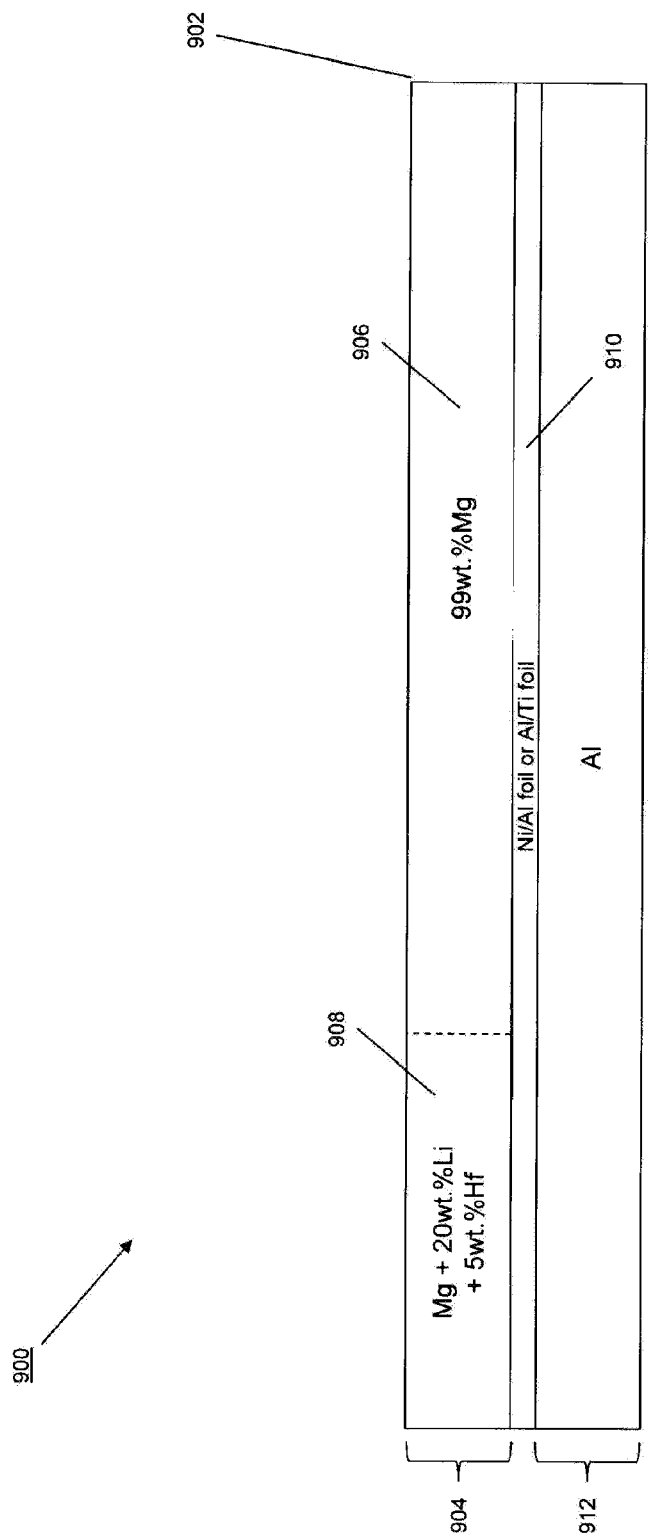
FIG. 9 is a cross-sectional view illustrating an experimental embodiment of a chassis base.

Referring now to FIG. 8, in another experimental embodiment, blocks 402, 404, and 406 of the method 400 provided a chassis base 802 having a first layer 804 with the center portion 806 including 99 wt. % Magnesium and the edge portion 808 including Magnesium and 20 wt. % Lithium. No interlayer was provided in this experimental embodiment. At block 410, a second layer 810 including an Aluminum and Magnesium foam was diffusion bonded to the first layer 804. In one example, Aluminum and Magnesium foam, or other metal foam materials, include a cellular structure having a solid metal, frequently Aluminum, that includes a large fraction of gas-fill pores or other voids that can be greater than 50 micrometers, which can lead to a density reduction of 30-50%. The pores can be sealed (closed-celled foam) or they may form an interconnected network (open-cell foam). The high porosity (75-95% of the volume including voids) make such materials ultralight, while still providing strength according to a power-law relationship to the density (i.e., a 20% dense material is more than twice as strong as a 10% dense materials. The resulting chassis base 802 included an edge section 808 capable of withstanding a flexure stress $\sigma_m$ of approximately 30 MPa.

Referring now to FIG. 8, in another experimental embodiment, blocks 402, 404, and 406 of the method 400 provided a chassis base 902 having a first layer 904 with the center portion 906 including 99 wt. % Magnesium and the edge portion 908 including Magnesium, 20 wt. % Lithium, and 5 wt. % Hafnium. In one experimental example, at block 408, an interlayer 910 of Nickel/Aluminum foil was provided on the first layer 904. In another experimental example, at block 408, an interlayer 910 of Aluminum/Titanium foil was provided on the first layer 904. In both experimental examples, at block 410, a second layer 912 including at least 95 wt. % Aluminum was bonded via a solid state reaction to the first layer 904 that included using a laser pulse to initiate an exothermic reaction that resulted in the diffusion of the metals having different melting points. The resulting chassis base 902 included an edge section 908 capable of withstanding a flexure stress $\sigma_m$ of approximately 70 MPa.

While the above experimental embodiments all involve the chassis base 202 with the center portion 204a including 99 wt. % Magnesium, it is expected that similar results may be achieved with a chassis base 202 including at least 95 wt. % Magnesium, at least 95 wt. % Aluminum, or at least 95 wt. % Titanium, and having its edge section 204b doped similarly to the different chassis bases including 99 wt. % Magnesium as described above in the experimental embodiments.

Thus, a chassis base (and method for providing a chassis base) have been described that provide a variable stiffness chassis with desired properties such as, for example, the increased flexure stress capabilities at the edge section discussed above. As discussed above, a laminate or composite structure may be created for a chassis base structure with a rectangular shape and having a thickness of less than or equal to 1 millimeter. It has been found that, using at least 95 wt. % Magnesium or Aluminum chassis base, the edge section may be doped (and laminated in some embodiments) as discussed above to achieve a ratio of ultimate strength to density of greater than 100 MPA-cm$^3$/g, a bulk modulus of greater than 25 GPa, and a bonding strength of greater than 30 MPA using diffusion bonding. In some embodiments, the center portion of the chassis base may be provided with a ratio of bulk modulus to shear modulus of greater than 1.75 (the rough ratio of transition from brittle to ductile behavior) in order to reduce deflection under loading (e.g. typically greater than 20 lbf force.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method, comprising:
providing an Information Handling System (IHS) chassis base that includes at least ninety-five weight percent of a first metal element that is one of Aluminum or Magnesium;
selectively doping the IHS chassis base at an edge section, which extends around the circumference of the IHS chassis base and that is located adjacent a center portion of the IHS chassis base, with at least five weight percent of at least one second metal element that is selected from the group including Lithium, Titanium, Tungsten, Chromium, Hafnium, Lanthanum, and Ytterbium, such that the center portion is not doped with the at least one second metal element; and
heat treating the IHS chassis base such that the center portion of the IHS chassis base includes the at least ninety-five weight percent of the first metal element and the edge section of the IHS chassis base includes the at least five weight percent of the at least one second metal element.

2. The method of claim 1, wherein the selectively doping includes selectively doping the IHS chassis base at the edge section with one second metal element selected from the group consisting of at most twenty weight percent of Lithium, at most twenty weight percent of Lithium and at most five percent weight percent of Lanthanum or Ytterbium, and at most twenty percent Lithium and at most five weight percent Hafnium.

3. The method of claim 1, wherein the center portion and the edge section of the IHS chassis base are provided as a first layer of the IHS chassis base, the first metal element is Magnesium, and the method further comprises:
coupling a second layer that includes at least ninety-five weight percent of Aluminum to the first layer.

4. The method of claim 3, further comprising:
providing an interlayer between the first layer and the second layer.

5. The method of claim 3, wherein the first layer and the second layer are bonded using a diffusion bonding process, and the selectively doping includes selectively doping the IHS chassis base at the edge section with at least one second metal element selected from the group consisting of at most twenty weight percent of lithium, at most twenty weight percent of Lithium and at most five percent weight percent of Lanthanum or Ytterbium, and at most twenty weight percent lithium and at most five weight percent Hafnium.

6. The method of claim 3, wherein the first layer and the second layer are bonded using a solid state reaction and the selectively doping includes selectively doping the IHS chassis base at the edge section with at most twenty weight percent Lithium and at most five weight percent Hafnium.

7. The method of claim 3, further comprising:
coupling a second layer that includes a metal foam material to the first layer.

* * * * *